US007633977B2

(12) United States Patent
Sanders et al.

(10) Patent No.: US 7,633,977 B2
(45) Date of Patent: Dec. 15, 2009

(54) MULTISPECTRAL LASER WITH IMPROVED TIME DIVISION MULTIPLEXING

(75) Inventors: Scott Thomas Sanders, Madison, WI (US); Thilo Kraetschmer, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/835,842

(22) Filed: Aug. 8, 2007

(65) Prior Publication Data

US 2009/0041465 A1 Feb. 12, 2009

(51) Int. Cl.
*H01S 3/30* (2006.01)

(52) U.S. Cl. .............................. 372/6; 372/25; 372/26; 372/28; 372/30; 372/32

(58) Field of Classification Search .................... 372/6, 372/25, 26, 28, 29.023, 30, 32, 102
See application file for complete search history.

(56) References Cited

U.S. PATENT DOCUMENTS 5,912,178 A 6/1999 Porter et al.
6,014,237 A * 1/2000 Abeles et al. ................ 398/87
6,148,011 A 11/2000 Larose et al.
6,192,058 B1 * 2/2001 Abeles ......................... 372/6
2005/0190802 A1 9/2005 Richardson et al.
2006/0187537 A1 8/2006 Huber et al.

OTHER PUBLICATIONS

Kraetschmer, Thilo, et al., Multiwavelength, Frequency-Division-Multiplexed Light Source Based on Dispersion Mode Locking., IEEE Photon. Technol. Lett., vol. 19, pp. 1607-1609, 2007.

Adams, Richard, PCT International Search Report, Aug. 13, 2009, PCT International Searching Authority, European Patent Office, Rijswijk, The Netherlands.

* cited by examiner

*Primary Examiner*—Minsun Harvey
*Assistant Examiner*—Kinam Park
(74) *Attorney, Agent, or Firm*—Boyle Fredrickson, S.C.

(57) ABSTRACT

A laser provides a cavity with complementary wavelength-dependent delay elements to provide the same optical length but time-staggered light paths for different colors. This provides the ability to individually control multiple narrow bands of colors each in a separate time division window.

22 Claims, 6 Drawing Sheets

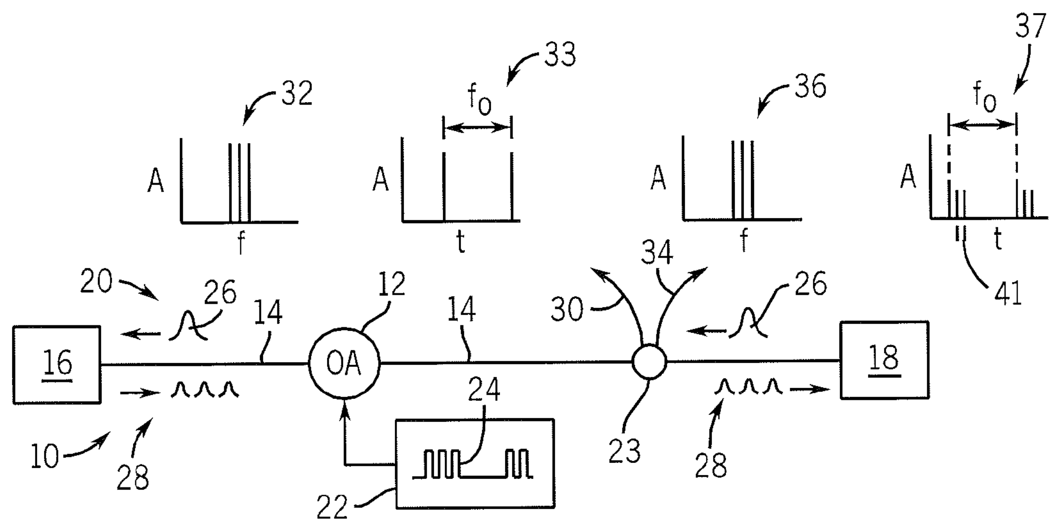
FIG. 1
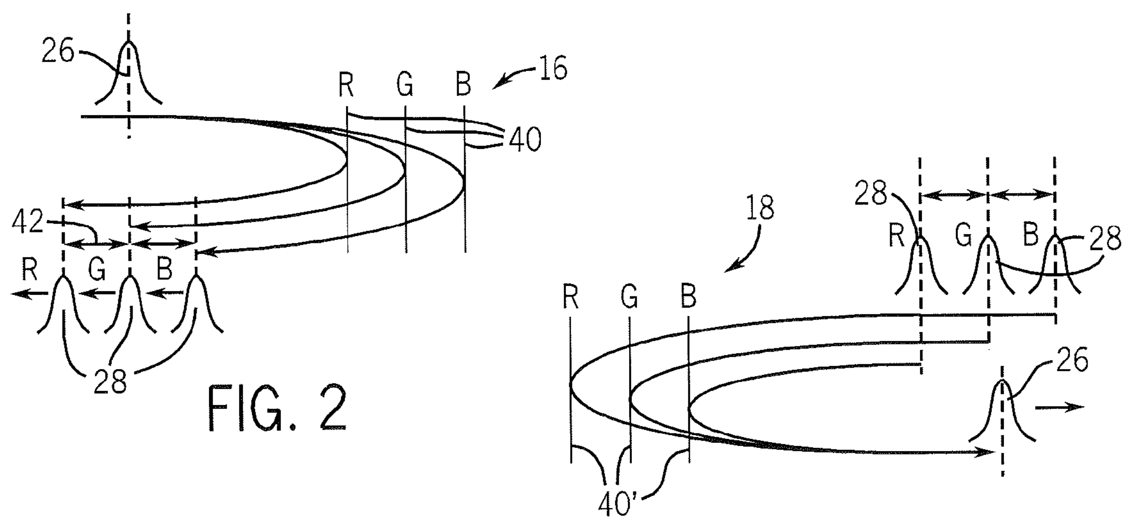
FIG. 2
FIG. 3
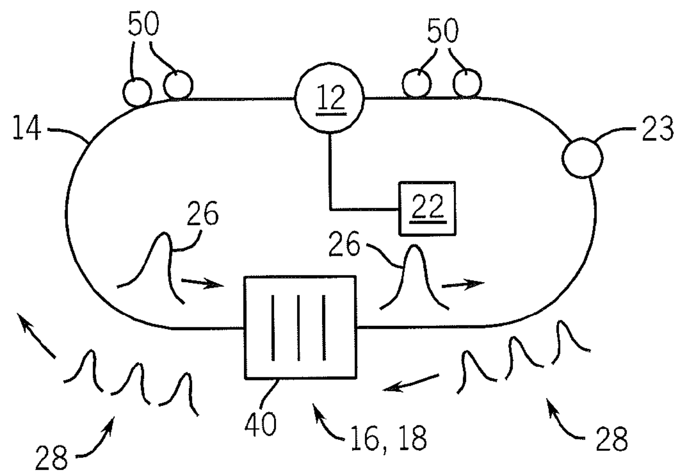
FIG. 4

12
14
14
40
26
64

26
26'
12
24c
14

14
40

28
70
68
68

22
12
68
26b
26
23
14
40
14
26b
16, 18
72
26a

MULTISPECTRAL LASER WITH IMPROVED TIME DIVISION MULTIPLEXING

STATEMENT REGARDING FEDERALLY SPONSORED RESEARCH OR DEVELOPMENT

This invention was made with United States government support awarded by the following agencies: NSF 0238633. The United States has certain rights in this invention.

BACKGROUND OF THE INVENTION

The present invention relates to lasers and in particular to lasers capable of providing multiple discrete output colors switched in time (time division multiplexing).

Many important applications for lasers require multiple and specific wavelengths. For example, U.S. Pat. No. 5,912,178 entitled: "Passive Measurement of Isotopes to Monitor Health", assigned to the assignee of the present invention and hereby incorporated by reference, describes a system for monitoring the ratio of $C^{12}$ to $C^{13}$ in a patient's breath to establish the health of the patient. In this application, a first laser may provide a beam having a wavelength aligned with a $C^{12}O^{16}{}_2$ feature and a second laser may provide a beam having a wavelength aligned with the $C^{13}O^{16}{}_2$ feature. In addition, a third laser may provide a beam having an intermediate wavelength with negligible absorption by $CO_2$ as a baseline reference.

In order to detect absorption of the laser light separately for each of these features, multiple optical paths and detectors may be used, or the different colors may be separated optically using filters or the like. The need for multiple lasers and associated optical components increases the cost and size of such systems.

Co-pending U.S. application Ser. No. 11/749,553, filed on May 16, 2007, assigned to the same assignee as the present invention, and hereby incorporated by reference, describes a laser that may produce multiple discrete output colors using a laser cavity having a different effective optical length at the different colors. The desired colors are selected by pulsing (switching on) an optical amplifier at multiple different boost frequencies to boost only those cavity modes compatible with the desired colors. This "mode locking" process allows the generation of two or more, narrow linewidth, predetermined output colors, each modulated by the different boost frequencies applied to the optical amplifiers. This modulation allows the different colors to be distinguished not only by frequency of the light but also by the frequency of their modulation.

SUMMARY OF THE INVENTION

The laser of the present invention employs a cavity that provides the same cavity length for each color but introduces a fixed time shift in the arrival of each color at the output coupler as a function of the color. This may be contrasted to the prior laser described above which provides a cavity with a different cavity length for each color.

In a preferred embodiment the cavity is produced by a reflector at a first end of the cavity that increases the delay (e.g. path length) of light striking that reflector as a function of color, and a reflector at the second end of the cavity that decreases the delay (e.g. path length) of the light as a function of color to exactly offset the effect of the reflector at the first end of the cavity. In this way, the cavity length for all colors is the same, but in half of their round-trip between the reflectors, they are shifted in phase.

An optical amplifier in the cavity is switched to encourage the desired colors and to cull other light pulses thereby producing a set of monochromatic components of predetermined different colors.

The laser of the present invention provides a number of benefits. First, monochromatic components may pass through the optical amplifier at different times during every cycle in the cavity eliminating gain competition that can cause power fluctuation in those pulses. Second, monochromatic components of different colors pass through the optical amplifier in the same sequence and with the same relative timing during every cycle in the cavity greatly simplifying the circuitry for controlling the optical amplifier and for distinguishing the output pulses. Third, the optical cavity can present substantially the same optical path for monochromatic components of different colors, thus providing balanced attenuation of the monochromatic components.

Specifically then, the present invention provides a laser including an optical amplifier receiving light and boosting the amplitude of the light by stimulated emission according to a control signal. A laser cavity holds the optical amplifier between a wavelength-dependent delay element (WDE) temporally separating a multispectral light pulse into constituent monochromatic components, and a complementary wavelength-dependent delay (CWDE) element temporally collecting the monochromatic components after separation by the WDE. A waveform generator provides the control signal to the optical amplifier timed to boost selected pulses circulating in the laser cavity at predetermined times when the pulses pass through the optical amplifier.

It is thus a feature of one embodiment of the invention to provide a novel laser cavity presenting a constant optical path length to all colors thereby improving the control and consistency of multiple, discrete monochromatic components of light.

The control signal may operate to first generate a multispectral pulse directed to the WDE, and then to individually boost the monochromatic components emitted by the WDE as they pass through the optical amplifier in a first direction.

Thus it is a feature of one embodiment of the present invention to allow independent control of a series of monochromatic components.

The control signal may boost a multispectral pulse (reformed from the monochromatic components) emitted by the CWDE as the multispectral pulse passes through the optical amplifier.

It is thus a feature of one embodiment of the present invention to maximize amplification of the photons by boosting them as they pass through the optical amplifier in either direction.

The WDE and CWDE operate to disperse a multispectral pulse into monochromatic components and then collect the monochromatic components back into a multispectral pulse when pulses of the laser beam make one cycle through the WDE and CWDE.

It is thus another feature of one embodiment of the invention to preserve a constant phase offset and constant frequency of the monochromatic components between successive cycles in the laser cavity thereby simplifying the control of the optical amplifier and the ability to distinguish monochromatic components of different colors by time division in absorption spectroscopy and the like.

The WDE separates the monochromatic components so that substantially only one monochromatic component passes through the optical amplifier at a time as the monochromatic components pass from the WDE to the CWDE.

It is thus a feature of one embodiment of the invention to significantly reduce gain competition between different frequencies within the optical amplifier.

The optical length of the cavity is in excess of 1/10 of 1 km.

It is thus another feature of one embodiment of the invention to space the monochromatic components to provide easy time division demodulation.

The WDE and CWDE may operate on discrete narrowband frequencies having a spectral line width of less than one gigahertz.

It is thus a feature of one embodiment of the invention to produce monochromatic components of very narrow linewidth.

The WDE and CWDE are linear arrays of Bragg filters of different predetermined frequencies.

It is thus a feature of one embodiment of the invention to provide a simple mechanism for realizing the WDE and CWDE and one that is simply adapted to fiber-optic lasers through the use of fiber Bragg gratings.

The WDE and the CWDE may be the same fiber Bragg filter arrays receiving light from different directions to provide the WDE and the CWDE.

It is thus another feature of one embodiment of the invention to provide for improved matching between the optical path lengths experienced by different monochromatic components. By using the same array of Bragg filters, minor errors in the separation of the gratings are canceled over a single cycle within the cavity.

The control signal of the waveform generator may be periodic with a period equal to one cycle of a pulse of the laser beam within the laser cavity.

It is thus a feature of one embodiment of the invention to provide for a simple control signal that repeats regularly for the period of cavity resonance, simplifying tuning of the waveform generator and eliminating overlap of the monochromatic components within the optical amplifier as could occur with a multifrequency control signal.

The optical amplifier is asymmetrically positioned in optical distance with respect to the WDE and CWDE.

It is thus a feature of one embodiment of the invention to permit the suppression of pulses symmetrically emitted from the optical amplifier when it boosts light within the laser cavity. By asymmetrical placement of the optical amplifier, pulses emitted in a single direction may be favored through the timing of subsequent boost cycles.

The laser may include an output coupler for preferentially extracting the monochromatic components delivered by the WDE before the pulses next arrive at the CWDE.

It is thus a feature of one embodiment of the invention to provide a time division multiplexed sequence of monochromatic components.

Alternatively or in addition the laser may include an output coupler for preferentially extracting multispectral pulses received by the CWDE before the pulses next arrive at the WDE.

It is thus a feature of one embodiment of the invention to provide a high powered multispectral pulse.

The control signal from the waveform generator may boost different monochromatic components by different predetermined different amounts as the monochromatic components pass separately through the optical amplifier.

It is thus a feature of one embodiment of the invention to allow selective gain control of different colors, for example, to produce a substantially flat power spectra for improved attenuation studies and the like.

The laser may include an optical element for reducing light passing from the CWDE to the WDE with respect to light passing from the WDE to the CWDE to pass through the optical amplifier.

It is thus a feature of one embodiment of the invention to prevent overloading of the optical amplifier by the boosted multispectral pulse.

The laser may further include at least one additional optical amplifier receiving light and boosting the amplitude of the light by stimulated emission according to a control signal and at least one additional laser cavity holding the additional optical amplifier between an additional WDE and an additional CWDE, wherein the additional WDE and CWDE operate in a different frequency range than the CWDE and WDE. In this case, the waveform generator may provide the same control signal to the optical amplifier and at least one additional optical amplifier.

It is thus another feature of one embodiment of the invention to permit tandem operation of multiple laser cavities providing different monochromatic components for greater frequency range.

These particular features and advantages may apply to only some embodiments falling within the claims and thus do not define the scope of the invention.

BRIEF DESCRIPTION OF THE DRAWINGS

FIG. 1 is a block diagram of a first embodiment laser of the present invention showing an optical amplifier positioned between a wavelength-dependent delay element (WDE) and a complementary wavelength-dependent delay element (CWDE) and showing an optical coupler for extracting either multispectral pulses or time division monochromatic components from the laser;

FIG. 2 is a schematic representation of the WDE of FIG. 1 implemented as a set of spaced apart Bragg gratings showing a receipt of a multispectral pulse from the right to produce reflected, time-spaced constituent monochromatic components 28;

FIG. 3 is a figure similar to that of FIG. 2 showing a set of spaced apart Bragg gratings receiving the time-spaced constituent monochromatic components from the left to produce a reconstituted and reflected multispectral pulse;

FIG. 4 is a figure similar to FIG. 1 showing an alternative embodiment of the laser of the present invention in which the function of the WDE and CWDE are implemented by a single set of Bragg mirrors having right and left input ports providing respectively the functions of the WDE and CWDE;

DETAILED DESCRIPTION OF THE PREFERRED EMBODIMENT

Figure 5:
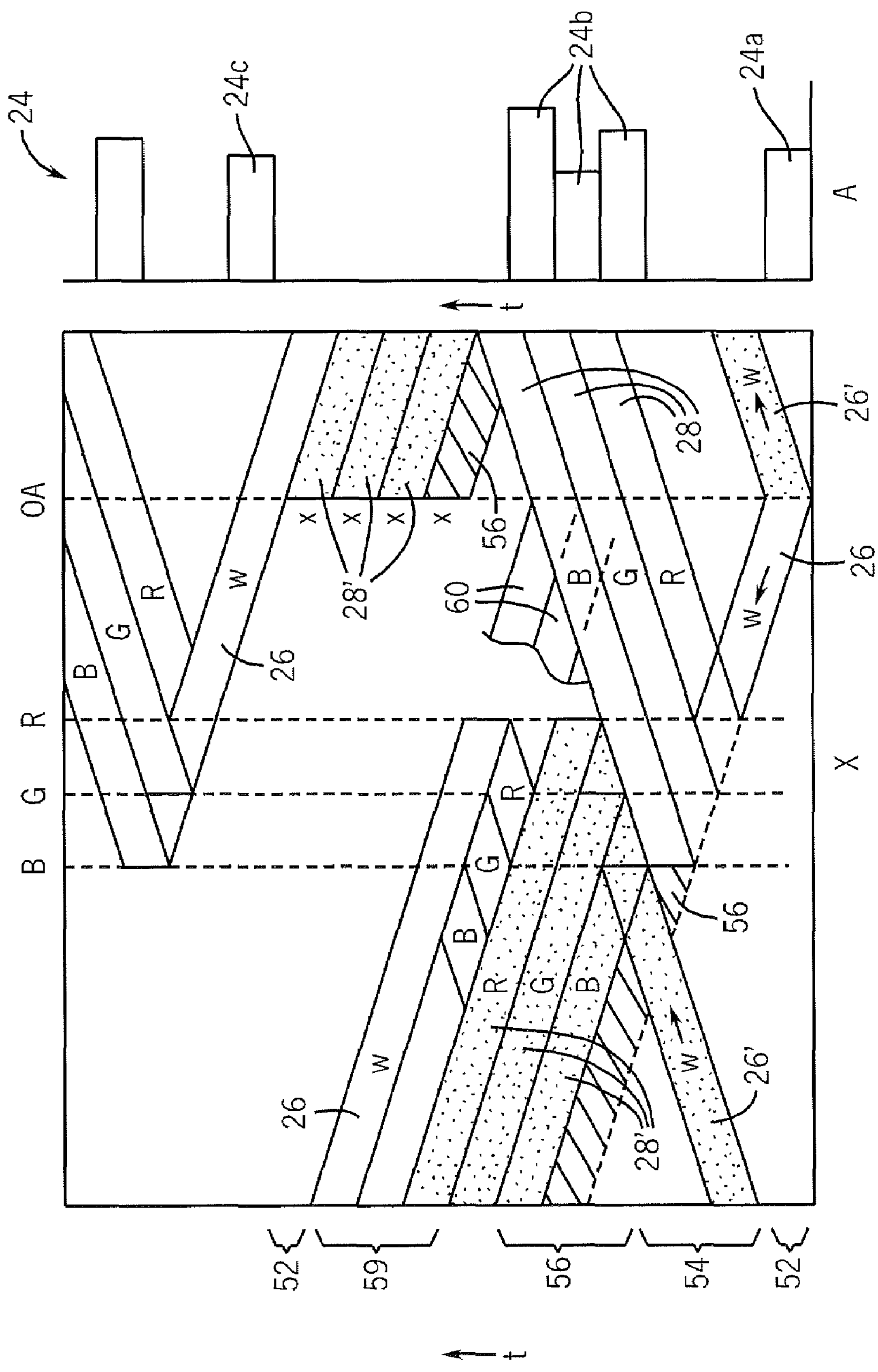
FIG. 5 is a set of two aligned graphs, the first graph plotting distance along the optical cavity (the horizontal axis) as a function of time (the vertical axis) for various multispectral and monochromatic components spanning slightly more than one cycle within the laser cavity, and the second graph plotting control signal power (the horizontal axis) applied to the optical amplifier of the laser versus time (the vertical axis) showing selective activation of the optical amplifier to boost and cull the various pulses within the laser cavity.

Referring now to FIG. 1, a first embodiment of a laser 10 constructed according to the present invention includes an optical amplifier 12 attached to an optical fiber 14 extending from opposite sides the optical amplifier 12. A left end of the optical fiber (as depicted) terminates at a wavelength-dependent delay element 16 (WDE) and a right end of the optical fiber terminates at a complementary wavelength-dependent delay element 18, (CWDE) respectively. The fiber 14 and the WDE 16 and the CWDE 18 together form a laser cavity 20 providing for the circulation of photons along the fiber 14 between the WDE 16 and CWDE 18 and through the optical amplifier where they are boosted by stimulated emissions, as is understood in the art, to provide for a laser.

The WDE is commonly termed a "chromatic stretcher" and the CWDE is commonly termed a "chromatic compressor". When a multispectral pulse passing successively through these two elements is substantially unchanged, the chromatic stretcher and chromatic compressor are "matched".

The optical amplifier 12 is connected to an electrical waveform generator 22 which can produce a periodic pulse signal 24. During periods when the pulse signal is "high", e.g. when power is applied to the optical amplifier 12, the optical amplifier 12 will boost photons passing through the optical amplifier 12 by stimulated emissions. The amount of boost will depend on the amplitude of the pulse. When the pulse signal 24 is "low" and no power is applied to the optical amplifier 12, the optical amplifier 12 will attenuate photons passing through it.

The optical amplifier 12 may be, for example, a semiconductor optical amplifier (SOA) or other optical amplifier generally understood in the art. More generally, the optical amplifier may be any modulator, such as an optical switch coupled with some optical gain element.

As will be described in greater detail below, the optical amplifier 12 is activated during operation of the laser 10 to initiate or transmit a multispectral pulse 26 traveling leftward along the optical fiber 14 toward the WDE 16. The WDE 16 reflects the multispectral pulse 26, breaking it into spaced monochromatic components 28 by means of the wavelength-dependent delay of the WDE 16. These monochromatic components 28 pass rightward along the fiber 14 through the optical amplifier 12 to be received by the CWDE 18 which reforms the monochromatic components 28 into a single multispectral pulse 26 by means of the complementary wavelength-dependent delay produced by the CWDE 18. This multispectral pulse 26 again passes leftward along the fiber 14 completing one cycle of laser light in the laser cavity 20.

An output coupler 23 may be positioned along the fiber 14, for example, between the optical amplifier 12 and the CWDE 18 to extract a portion of the light while preserving the laser action. The coupler 23 may have a "leftward" output 30 to extract the multispectral pulse 26 having a spectrum 32 with multiple discrete colors and pulse frequency $f_0$ shown by time-plot 33. Alternatively, or in addition, the coupler 23 may provide a "rightward" output 34 extracting the spaced, monochromatic components 28 each providing one of the discrete colors of spectrum 32 (as shown by spectrum 36) with each monochromatic component 28 occurring in a separate time division multiplexed window 41 reoccurring at pulse frequency $f_0$ as shown by time-plot 37. The monochromatic components 28 may be evenly spaced in time and have a consistent frequency ordering. Generally the amplitude and thus the power of the multispectral pulse 26 will be equal to the sum of the power of the individual monochromatic components 28 less losses in the CWDE 18.

Referring now to FIG. 3, the WDE 16 may be implemented by a linear array of spaced Bragg gratings 40 each having different characteristic frequencies of light reflection. For simplicity the Bragg gratings 40 are labeled: R (red), G (green), and B (blue) to represent three different arbitrary characteristic frequencies of successively shorter wavelength. Note that each line in fact represents a set of regularly spaced grating modulation elements (layers of varying index of refraction) as would be understood in the art.

As is understood in the art, the characteristic frequency of the Bragg gratings 40 is determined by a spacing of the grating modulation elements within the gratings 40 with shorter wavelengths corresponding to closer spacing of the grating modulation elements. Generally, these gratings 40 may be implemented as fiber Bragg gratings to be compatible with the fiber 14.

The Bragg gratings 40 are separated along the path of light through the fiber 14 by a sufficient distance so that the time required for light to pass from one grating 40 to the next is greater than the duration of the multispectral pulse 26. Each Bragg grating 40 will generally block and hence reflect light at its characteristic color and as a result, as the multispectral pulse 26 arrives at each grating 40, a monochromatic component 28 of the characteristic frequency of that grating 40 will be separated from the multispectral pulse 26 by reflection. These successive monochromatic components 28 will be separated in time by a constant amount 42 determined by the separation of the gratings 40.

As shown, the multispectral pulse 26 arrives at gratings 40 in R, G, B order and thus the monochromatic components 28 are reflected with a leading pulse at the characteristic frequency R and the trailing pulse at the characteristic frequency B.

The gratings 40 are thus selected to correspond to the desired output frequencies of the monochromatic components 28 of the laser 10. It should be noted that the gratings 40 need not be in any particular frequency order and may have any desired absolute frequency value so long as the colors of the monochromatic components 28 may be accommodated by the optical fiber 14 and the optical amplifier 12. In one embodiment, a center color may be 700 nm.

Referring now to FIG. 3, the CWDE 18 may also be implemented by a linear array of spaced Bragg gratings 40' but in the opposite order as the Bragg gratings 40 of the WDE 16. The monochromatic components 28 received by the CWDE 18 in the order R, G, and B, are thus realigned in time to reform the multispectral pulse 26 the gratings 40 ordered in space so that the leading monochromatic component 28 with the characteristic frequency R travels furthest before reflection and the trailing monochromatic component 28with the characteristic frequency B travels the shortest distance before reflection.

Referring now to FIG. 4, the correspondence between the gratings 40 of the WDE 16 and the gratings 40' of CWDE 18 allows a single set of gratings 40 to implement both the WDE 16 and the CWDE 18 simply by conducting the monochromatic components 28 for the WDE 16 into one side of the gratings 40 and the multispectral pulses 26 for the CWDE 18 into the other side of the grating 40 using a loop of optical fiber 14. Specifically, the optical fiber 14 exits the left side of the optical amplifier 12 to enter the left side of the array of gratings 40 to implement the function of the WDE 16 and the optical fiber 14 exits the right side of the optical amplifier 12 to enter the right side of the gratings 40 to implement the function of the CWDE 18. Polarization controls 50 of a type known in the art may be positioned along the fibers 14 to correct for polarization of the fiber 14.

In both the embodiments of FIG. 1 and 4, the optical amplifier 12 is located asymmetrically between the WDE 16 and CWDE 18 so that the time required for a pulse of light to travel between the optical amplifier 12 and the WDE 16 is different from the time required for a pulse of light to pass from the optical amplifier 12 to the CWDE 18.

Figure 6A:
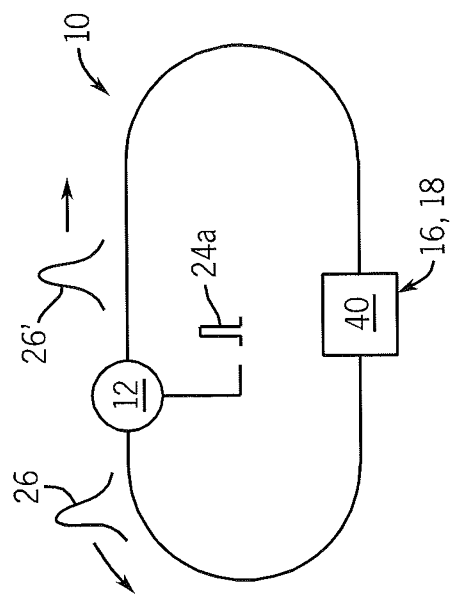
FIGS. 6*a*-6*f* are simplified representations of the laser of FIG. 4 showing various pulses of FIG. 5 at different stages in a cycle of pulses within the laser cavity.

Referring now to FIGS. 5 and 6*a*, in operation, at a first time 52, a pulse 24*a* of the periodic pulse signal 24 from the waveform generator 22 is applied to the optical amplifier 12 to produce a short multispectral pulse 26 passing leftward from the optical amplifier 12 and a corresponding and diverging multispectral pulse 26' passing rightward from the optical amplifier 12. In FIG. 5, these multispectral pulses 26 and 26' are shown passing leftward and rightward from a dotted line indicating a position of the optical amplifier and marked "OA".

Figure 6B:
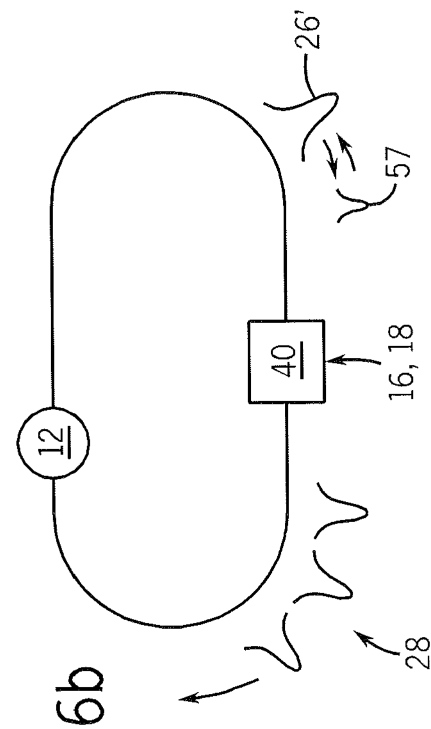

Referring now to FIGS. 5 and 6*b*, the multispectral pulse 26 will arrive at the gratings 40 (shown by vertical lines labeled B, G, and R in FIG. 5), as indicated by time 54 in FIG. 5. At this time the multispectral pulse 26 will reflect off of gratings 40 (entering from the left) breaking into monochromatic components 28 that will return clockwise around the optical fiber 14 to the optical amplifier 12. A small portion of the multispectral pulse 57 will pass through the grating 40 (based the gratings 40 providing less than 100% reflection and not reflecting all frequencies) to head counterclockwise around the fiber back to the optical amplifier. At this time, multispectral pulse 26' has not yet arrived at grating 40 because of the asymmetrical location of the optical amplifier 12.

Figure 6C:
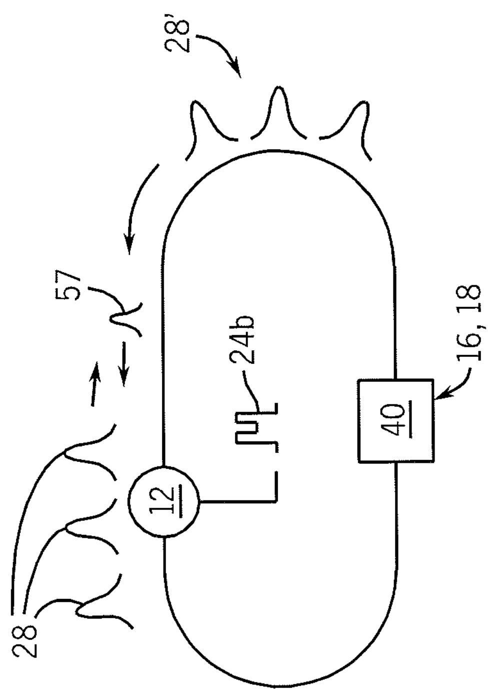

Referring now to FIGS. 5 and 6*c*, at time 56, multispectral pulse 26' will reflect off of the gratings 40 to produce monochromatic components 28' so that monochromatic components 28 and 28' respectively pass clockwise and counterclockwise toward the optical amplifier 12. The asymmetric location of the optical amplifier 12 causes the monochromatic components 28 to be received first passing rightward through the optical amplifier 12 at time 56 which pulse train 24*b* (comprised of three independently controllable pulses) is applied to the optical amplifier 12 boosting each of the monochromatic components 28 as it passes through the optical amplifier 12. Note that the pulse train 24*b* may have pulses of different amplitudes to apply different amounts of energy to each of the constituent monochromatic components 28. This allows correction for wavelength dependent attenuation of the monochromatic components 28 and 28' to be corrected so that a uniform set of pulse powers may be produced (as may be desirable for use of the pulses in absorption measurements) or that allows individual energy modulation of the pulses as may be used for communications or the like.

When the monochromatic components 28' and multispectral pulse 57 pass leftward through the optical amplifier 12 at time 59, no power is applied to the optical amplifier 12, causing the monochromatic components 28' and multispectral pulse 57 to be suppressed.

Figure 6D:
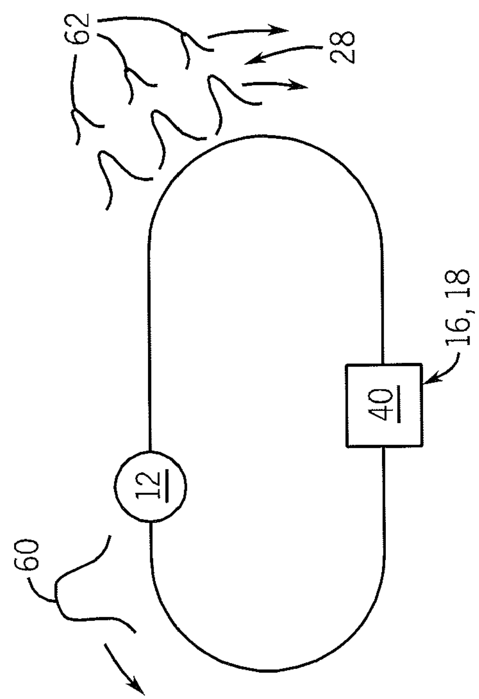

Referring now to FIG. 6*d*, the stimulation of the optical amplifier 12 by pulse train 24*b* as monochromatic components 28 pass through it (per FIG. 6*c*) boosts the monochromatic components 28 as they pass clockwise and again produces a multispectral pulse 60 passing counterclockwise away from the optical amplifier 12. This multispectral pulse 60 will be suppressed by the optical amplifier on its return from the grating 40 by configuring it to arrive at the optical amplifier at a time when the optical amplifier 12 is not stimulated.

Figure 6E:
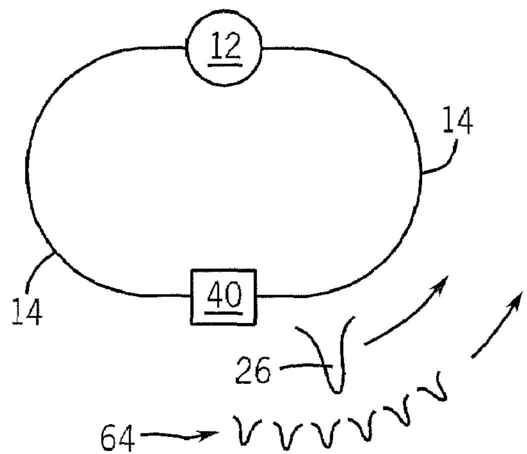

The process of boosting monochromatic components 28 also produces multispectral "shadows" 62 of lesser amplitude as part of that boosting process aligned with each of the monochromatic components 28 and the traveling in a clockwise direction. Referring now to FIG. 6*e*, the boosted monochromatic components 28 of FIG. 6*d* and their multispectral shadows 62 are received by grating 40 which reflects a boosted multispectral pulse 26. The multispectral shadows 62 are also reflected by the grating 40 but are each broken into many low amplitude monochromatic components 64 that are no longer time aligned with the boosted multispectral pulse 26.

Figure 6F:
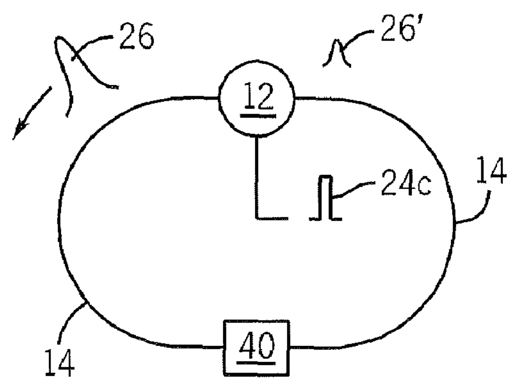

As shown in FIG. 6*f*, a final pass of the multispectral pulse 26 leftward through the amplifier 12 occurs in synchrony with the application of a pulse 24*c* which prunes in the low amplitude monochromatic components 64 which are largely outside the time window of the pulse 24*c*. This further boosting of the multispectral pulse 26 passing leftward from the optical amplifier 12 creates another rightward traveling multispectral pulse 26' and completes the cycle of light through the laser cavity 20. The pulse 24*c* is identical to that of pulse 24*a* and occurs at a time when the laser cavity has returned to a state analogous to that when pulse 24*c* occurred. Pulses 24*a* (or 24*c*) and 24*b* thus comprise a single cycle of the periodic pulse signal 24 that may be repeated indefinitely.

It will be understood that the pulse signal 24 is relatively simple to generate, repeating regularly at each cycle described from FIGS. 6*a* to 6*f* representing one round-trip passage of light through the laser cavity.

Figure 7:
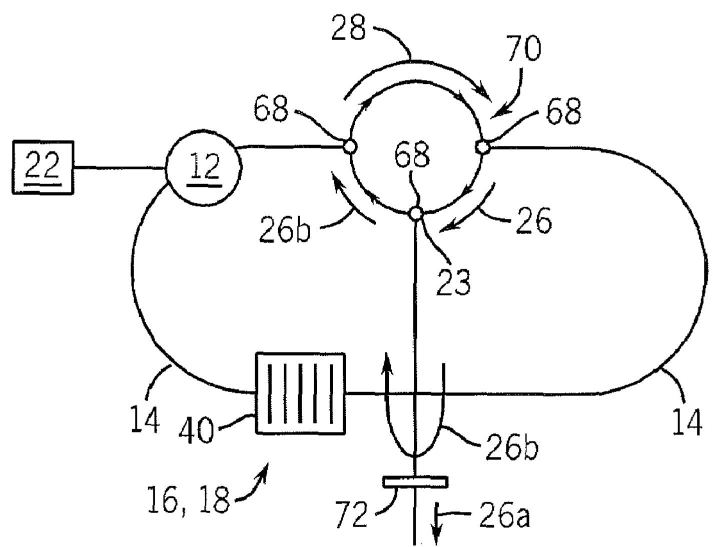
FIG. 7 is an alternative embodiment of the laser of FIGS. 4 using an optical circulator to permit multispectral pulses to bypass the optical amplifier.

Referring now to FIG. 7, it will be apparent from this description that the present invention may significantly boost a single multispectral pulse 26 by individually boosting its separate component monochromatic components 28. The amount of energy that can be added to the multispectral pulse 26 is limited by the power handling capacity of the amplifier 12. This limitation may be overcome by the placing of the optical amplifier 12 to one side of an optical circulator 70 of a type known in the art providing a unidirectional circulation (clockwise as depicted) of light through a circular loop of the optical circulator 70 among nodes 68. The optical circulator 70 may provide three nodes 68. An opposed left and right node 68 are each attached to right and left portions of optical fiber 14, in this case, with the left optical fiber 14 being received from the right side of the optical amplifier 12. A coupler 23 may be placed at a lower node 68 between left and right node 68 extracting light passing from right node 68 to left node 68.

The optical amplifier 12 receives the monochromatic components 28 described above as they pass clockwise through the laser 10 and are received by the optical circulator 70. In contrast, the boosted multispectral pulse 26 passes clockwise around the optical circulator 70 to the coupler 23. The coupler 23 extracts the boosted multispectral pulse 26, directing it toward a partially silvered mirror 72 to extract a portion of the multispectral pulse 26*a* and reflect a remainder of the multispectral pulse 26*b* of substantially reduced power back into the fiber 14 to the optical amplifier 12. In this way, separate stimulation of the individual monochromatic components 28 may be used to produce a single multispectral pulse 26 of higher amplitude than may be handled by the optical amplifier 12.

In a variation on the embodiment of FIG. 7 (not shown), the optical amplifier 12 may be placed in the optical circulator 70 above and between the left and right nodes 68 to receive only light, principally monochromatic components 28, passing counterclockwise around the optical circulator 70. This protects the optical amplifier 12 from the high intensity single multispectral pulse 26. An optical switch (providing a blocking, but not necessarily amplification) may be placed elsewhere in the laser cavity 12, for example, in the optical circulator 70 between and below the left and right nodes 68 to intercept single multispectral pulses 26 passing clockwise around the optical circulator 70 or elsewhere on the fiber 14, to block undesired light pulses.

Figure 8:
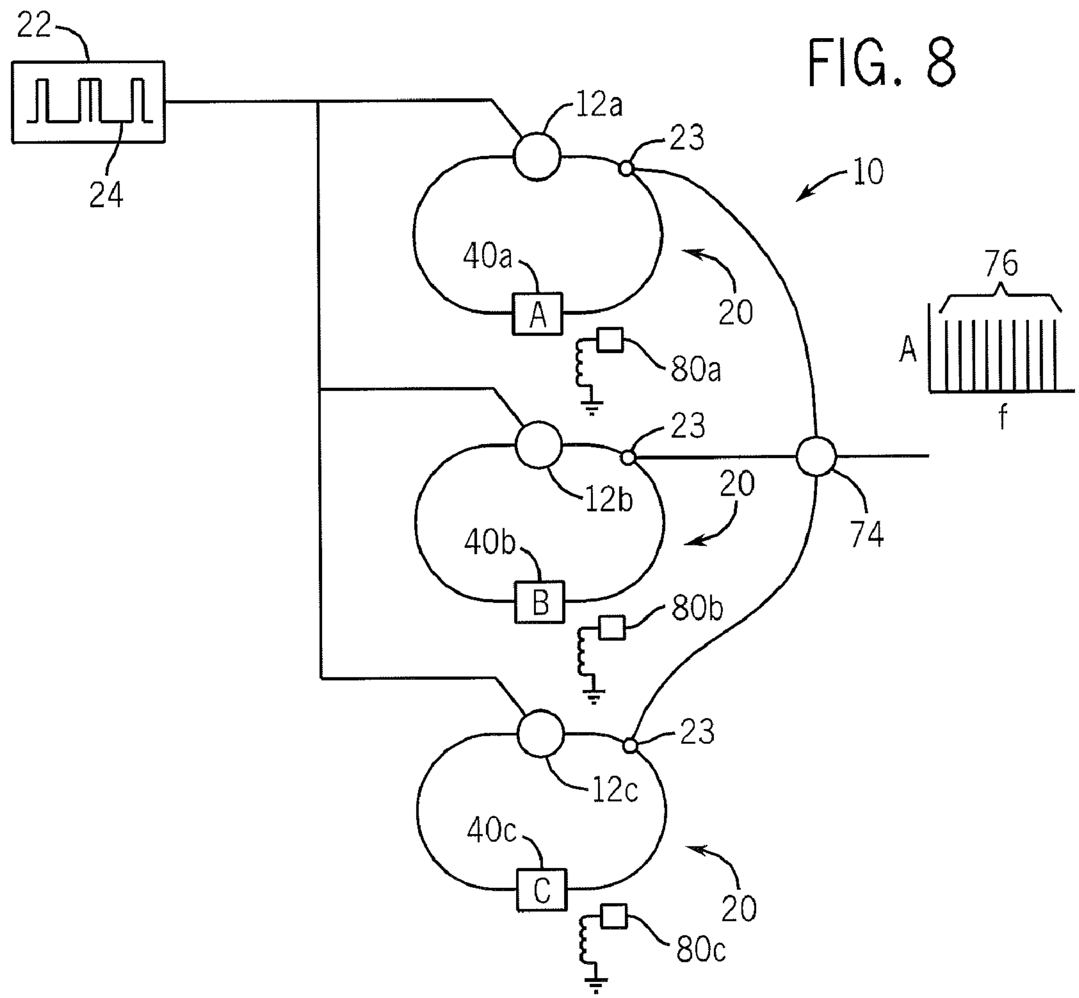
FIG. 8 is an alternative embodiment of the laser of FIG. 4 having multiple laser cavities operated by a single control signal generator for producing a wider range of colors.

Referring now to FIG. 8, the simplicity of the pulse signal 24 in the present invention and the fact that the spacing of the pulses of pulse signal 24 are largely determined by the length of the fiber 14 and the separation of the gratings 40 rather than the frequency of light of the laser, allows a single waveform generator 22 to provide power to multiple optical amplifiers 12*a*-12*c* associated with multiple laser cavities 20. Each of these laser cavities may have eight different linear arrays of gratings 40*a*-40*c* having each a unique characteristic frequency to provide a broader frequency range or larger number of unique monochromatic components 28 than may be practically obtained with a single laser cavity 20. The outputs from each of these cavities 20 extracted through respective couplers 23 may be combined by a combiner 74 to provide a single multispectral pulse 26 with multiple time division components spanning a larger frequency range 76.

Each of the gratings 40*a*-40*c* may be associated with a servo-controlled heater 80*a*-80*c* that may control the temperature of the gratings 40*a*-40*c* and thus characteristic colors output by the laser 10. The temperature controls thermal expansion of the fiber, for example, of a fiber Bragg grating, and thus controls the separation of the grating layers along the optical path changing their characteristic reflection frequency. A spectral sensor (not shown) may be used to sense the frequency of the output monochromatic components 28 and change the temperature of the heaters 80*a*-80*c* accordingly.

Figure 9:
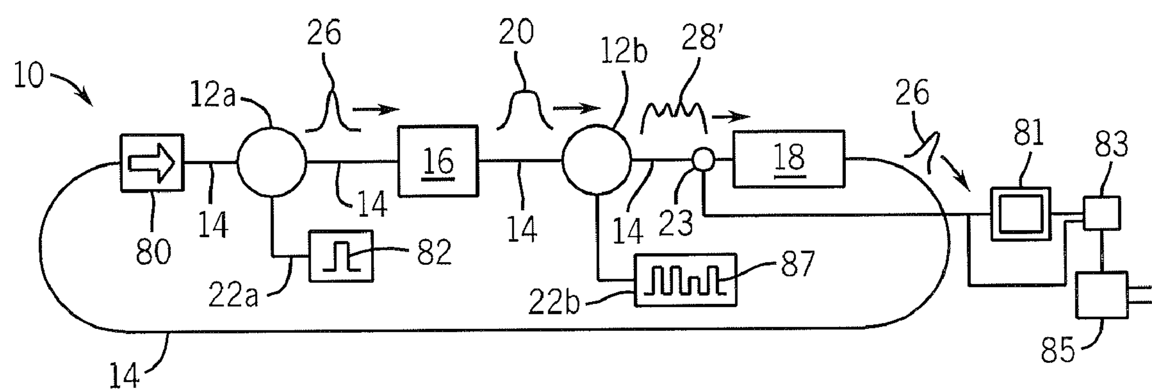
FIG. 9 is an alternative embodiment of the laser of FIG. 1 using a ring cavity rather than a linear cavity and with a transmissive rather than reflective WDE and CWDE.

Referring now to FIG. 9, in an alternative embodiment, the WDE 16 and CWDE 18 may be implemented not as reflective devices but as transmissive devices using lengths of single-mode chromatic dispersion and dispersion-correcting fibers that are matched to provide the same functions described above with respect to the Bragg gratings 40. In this case, the laser 10 uses two optical amplifiers 12*a* and 12*b*. A right side of amplifier 12*a* connects to the left side transmissive WDE 16 whose right side is connected to the left side of optical amplifier 12*b*. The right side of optical amplifier 12*b* is connected to the left side of CWDE 19 whose right side connects to the left side of an isolator 80. The isolator 80 operates as a one-way light "valve" allowing principally the passage of light only from left to right. The left side of the isolator 80 in turn connects to the right side of optical amplifier 12*a*.

In operation of the laser 10, the amplifier 12*a* is excited with a pulse 82 to produce a right-traveling multispectral pulse 26. In this multispectral pulse 26 is received by WDE 16 which in turn outputs time dispersed monochromatic components 28. These monochromatic components 28 are received by optical amplifier 12*b*, which in turn is driven by a pulse train 87 timed boost or suppressed various frequency components to output monochromatic components 28'. The monochromatic components 28' are received by CWDE 18 producing a multispectral pulse 26 is output from the right side of CWDE 18 to be conducted by fiber 14 to circulate again through amplifier 12*a*. The waveforms 82 and 87 are timed to promote the desired frequencies and to suppress other frequencies in a manner described above.

A coupler 23 may be placed after amplifier 12*b* and before the CWDE 18 to extract the dispersed monochromatic components 28 and direct them to a cavity 81 that may incorporate a material for spectroscopy. A broadband light sensor 83 may receive light selectively absorbed by the material in the cavity 20 and the light bypassing the cavity 20 and provide a difference signal for a time division demultiplexer 85 which may isolate the absorption of the individual frequency components of the monochromatic components 28.

Figure 10:
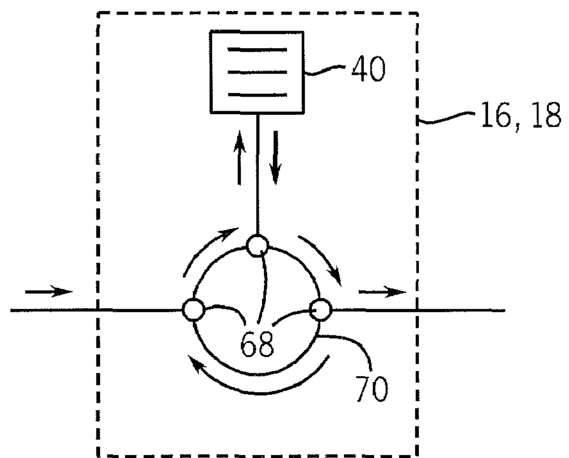
FIG. 10 is an alternative embodiment of a transmissive WDE or CWDE suitable for use in the embodiment of FIG. 9.

Referring now to FIG. 10, the transmissive WDE 16 and CWDE 18 of FIG. 9 may be implemented alternatively by means of a optical circulator 70 having a grating 40 attached to one of its nodes 68 so that light passing in one direction is rerouted to the gratings 40 and then after frequency dispersion (or collection) continues around the optical circulator 70 in the same direction so as to produce a transmissive time shifting.

Figure 11:
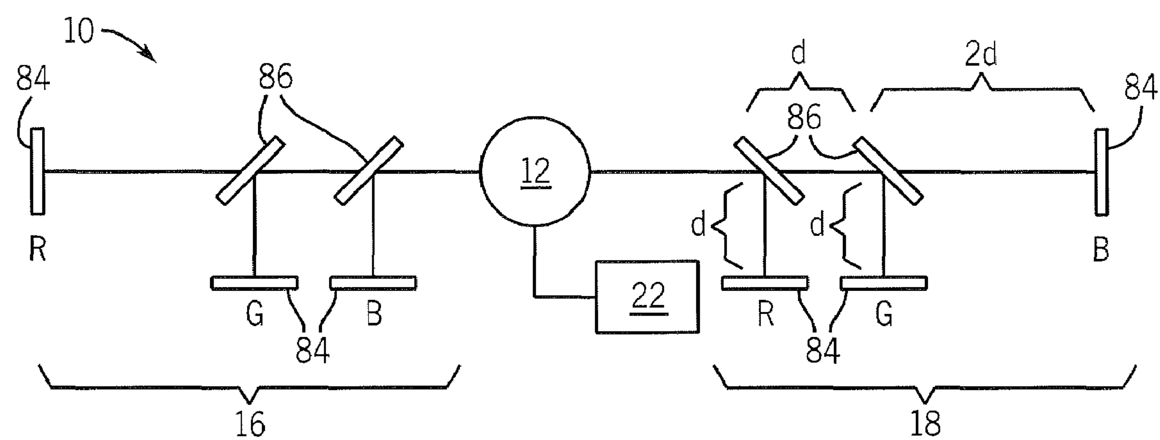
FIG. 11 is a free space version of the laser of FIG. 1 using narrowband reflectors.

Referring now to FIG. 11, the laser 10 of FIG. 1 may alternatively be implemented in a free space design (e.g., without fibers or continuous fiber conduction) using a set of narrowband or dichroic mirrors 84 labeled R, G, and B per the convention described above with respect to the Bragg filters 40 to implement the WDE 16 and CWDE 18 described with respect to FIG. 1.

Each mirror 84 of the WDE 16 and CWDE 18 is placed at a different optical distance from the optical amplifier 12 with, for example, the R mirror being furthest from the optical amplifier 12 and the B mirror being closest to the optical amplifier 12 for the WDE 16 on the left side of optical amplifier 12 and the R mirror being closest to the optical amplifier 12 and the B mirror being furthest from the optical amplifier 12 for the CWDE 18 on the right side of the optical amplifier 12. The light passing through the optical amplifier 12 may be separated to be received by the different mirrors 84, and the light from the different mirrors 84 may be combined into a single beam to be received by the optical amplifier 12 through the use of several beam splitters 86 servings separate beams for each mirror 84 and then to combine their reflections.

The present invention has been used to produce monochromatic components 28 including nineteen colors each at a unique wavelength in the 1330-1380 nm range. Each monochromatic component 28 occurs in a separate regularly spaced window 41 of approximately 200 ns in duration and separated by about 200 ns. The spectral line width of each channel may be less than one GHz. A tuning range of as much as 15 nm may be obtained through the use of the heater system described above. The fiber 14 may be approximately 1 km long to provide for the desired separation between these various pulses and typically will be a least 1/10 of 1 km long. It is believed that as many as 10,000 separate monochromatic components 28 each with a unique frequency may be generated.

It is specifically intended that the present invention not be limited to the embodiments and illustrations contained herein, but include modified forms of those embodiments including portions of the embodiments and combinations of elements of different embodiments as come within the scope of the following claims. The term "Bragg grating" should be considered synonymous with "Bragg filter" and "Bragg mirror" and other similar interference type reflectors. It will be understood to those of ordinary skill in the art that no time-limited pulse may be a single light frequency or "color" and thus that the term "monochromatic component" refers to a light component with a narrow spectral line width significantly less than the "multispectral pulse" and/or the light frequency bandwidth of the laser itself. Generally the particular sequence of gratings assigned to the WDE versus the CWDE is arbitrary provided they are in a complementary order to separate then recombine monochromatic components 28. The term "color" should be considered synonymous with "light-frequency" and does not imply a requirement that the light be within visible frequencies or have a particular perceived color. It will be understood that additional switches or other components may be introduced into the laser to provide for multiple passes through the WDE and then multiple passes through the CWDE.

I claim:

1. A laser comprising:

an optical amplifier receiving light and boosting light by stimulated emission according to a control signal;

a laser cavity holding the optical amplifier between a wavelength-dependent delay element (WDE) temporally separating a multispectral light pulse into constituent monochromatic light components that subsequently pass at different relative times through the optical amplifier and a complementary wavelength-dependent delay element (CWDE) temporally collecting the monochromatic light components after temporal separation by the WDE to subsequently pass substantially simultaneously through the optical amplifier as the multispectral light pulse; and a waveform generator providing the control signal to the optical amplifier timed to selectively boost monochromatic light components circulating in the laser cavity during predetermined times when the monochromatic light components pass through the optical amplifier at different relative times.

2. The laser of claim 1 wherein the control signal operates to:

(a) direct the multispectral light pulse to the WDE; and then (b) independently boost the temporally separated monochromatic light components as they pass through the optical amplifier in a first direction while suppressing some other components.

3. The laser of claim 2 wherein the control signal further operates to:

(c) boost the multispectral light pulse emitted by the CWDE recombining the monochromatic light components, as the multispectral light pulse passes through the optical amplifier in a second direction while suppressing some other components; and (d) repeat steps (b) and (c).

4. The laser of claim 1 wherein the WDE and CWDE operate to temporally separate the multispectral light pulse into monochromatic light components and then temporally-collect the separated monochromatic light components back into the multispectral light pulse as light from the laser beam makes one cycle through the WDE and CWDE.

5. The laser of claim 1 wherein the WDE separates monochromatic light components so that substantially only a single monochromatic light component passes through the optical amplifier at a time as the monochromatic light components pass from the WDE to the CWDE.

6. The laser of claim 5 wherein the optical length of the cavity is in excess of 1⁄10 of 1 km in length.

7. The laser of claim 1 wherein the WDE and CWDE separate and combine monochromatic light components each having spectral widths of less than one gigahertz.

8. The laser of claim 1 wherein the WDE and CWDE are linear arrays of Bragg filters having different characteristic rejection frequencies.

9. The laser of claim 1 wherein the WDE and CWDE are optical fibers providing differing temporal dispersions for different light colors.

10. The laser of claim 1 wherein the WDE and CWDE are frequency selective mirrors each receiving a portion of light from the optical amplifier and at different distances from the optical amplifier.

11. The laser of claim 1 wherein the WDE and the CWDE are physically separate Bragg filters arrays.

12. The laser of claim 1 wherein the WDE and the CWDE are the same Bragg filter arrays receiving light from different directions to provide the WDE and the CWDE.

13. The laser of claim 1 wherein the control signal of the waveform generator provides multiple boost components at different phases but substantially identical frequencies wherein the multiple boost components have different boost amounts.

14. The laser of claim 1 wherein the optical amplifier is asymmetrically positioned in optical distance with respect to the WDE and CWDE.

15. The laser of claim 1 further including an output coupler for preferentially extracting monochromatic light components delivered by the WDE before the monochromatic light components next arrive at the CWDE.

16. The laser of claim 1 further including an output coupler for preferentially extracting multispectral light pulse passing from the CWDE before the multispectral light pulse next arrives at the WDE.

17. The laser of claim 1 wherein the control signal from the waveform generator boosts monochromatic light components of different frequencies by different predetermined amounts as the monochromatic light components pass through the optical amplifier.

18. The laser of claim 1 further including passive optical element for reducing the light passing from the CWDE to the WDE with respect to the light passing from the WDE to the CWDE to pass through the optical amplifier.

19. The laser of claim 1 further including at least one additional optical amplifier receiving light and boosting the light by stimulated emission according to a control signal and at least one additional laser cavity holding the additional optical amplifier between an additional WDE and an additional CWDE;

wherein the additional WDE and CWDE operate in a different frequency range than the CWDE and WDE;

wherein the waveform generator provides the same control signal to the optical amplifier and at least one additional optical amplifier.

20. The laser of claim 1 further including:

a cavity for containing a material for absorption spectroscopy and positioned to receive the temporally separated monochromatic light components;

an optical sensor detecting the monochromatic light components passing through the optical cavity; and a time division demultiplexer providing a separate output value for each of a number of monochromatic light components.

21. A laser comprising:

an optical amplifier receiving light and boosting the light by stimulated emission according to a control signal;

a laser cavity holding the optical amplifier to promote a cycling of light photons through the optical amplifier; and a waveform generator providing the control signal to the optical amplifier to generate within the laser cavity multiple light pulses each providing different frequency components and to preferentially amplify a subset of these multiple light pulses to a predetermined level by timing of the control signal applied to the optical amplifier to coincide with times when the different light pulses pass individually through the optical amplifier.

22. A laser comprising:

an optical amplifier receiving light and boosting light by stimulated emission according to a control signal;

a laser cavity holding at least one optical amplifier between a chromatic stretcher and a substantially-matched chromatic compressor; and a waveform generator providing at least one control signal to at least one optical amplifier timed to boost selected light components circulating in the laser cavity during predetermined times by different predetermined amounts when the selected light components individually pass through the optical amplifier.

* * * * *